United States Patent
Jain et al.

(10) Patent No.: US 8,219,953 B2
(45) Date of Patent: Jul. 10, 2012

(54) BUDGETING ELECTROMIGRATION-RELATED RELIABILITY AMONG METAL PATHS IN THE DESIGN OF A CIRCUIT

(75) Inventors: Palkesh Jain, Bangalore (IN); Young-Joon Park, Plano, TX (US); Srikanth Krishnan, Richardson, TX (US); Guru Chakrapani Prasad, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 345 days.

(21) Appl. No.: 12/355,796

(22) Filed: Jan. 18, 2009

(65) Prior Publication Data

US 2009/0187869 A1 Jul. 23, 2009

Related U.S. Application Data

(60) Provisional application No. 61/021,649, filed on Jan. 17, 2008.

(51) Int. Cl.
*G06F 17/50* (2006.01)
(52) U.S. Cl. ........ 716/115; 716/106; 716/107; 716/108; 716/109; 716/132; 716/133; 716/134; 716/135; 716/136; 703/13; 703/14
(58) Field of Classification Search .......... 716/106–115, 716/132–136; 703/13–22
See application file for complete search history.

(56) References Cited

U.S. PATENT DOCUMENTS

| 6,532,570 | B1 * | 3/2003 | Mau | 716/130 |
| 6,578,178 | B2 * | 6/2003 | Mau | 716/115 |
| 6,832,361 | B2 * | 12/2004 | Cohn et al. | 716/113 |
| 6,971,082 | B2 * | 11/2005 | Shiratori | 716/115 |
| 7,200,829 | B2 * | 4/2007 | Kozhaya et al. | 716/112 |
| 7,752,582 | B2 * | 7/2010 | Jain et al. | 716/107 |
| 2009/0031264 | A1 * | 1/2009 | Rittman et al. | 716/5 |

OTHER PUBLICATIONS

William R. Hunter, "Self-Consistent Solutions for Allowed Interconnect Current Density—Part I:Implications for Technology Evolution", IEEE, vol. 44, No. 2, Dated: Feb. 1997, pp. 304-309.
William R. Hunter, "Self-Consistent Solutions for Allowed Interconnect Current Density—Part II:Application to Design Guidelines", IEEE, vol. 44, No. 2, Dated: Feb. 1997, pp. 310-316.

* cited by examiner

*Primary Examiner* — Nghia Doan
(74) *Attorney, Agent, or Firm* — John R. Pessetto; W. James Brady; Frederick J. Telecky, Jr.

(57) ABSTRACT

Apportioning unequally contributions of different metal paths of a circuit to electromigration (EM) reliability. In an embodiment, a corresponding parameter value representing a magnitude of excess current flowing in a single direction in each metal path is determined. A desired reliability measure for electromigration (EM) is apportioned among the metal paths based on computed parameter values for the corresponding metal path. A reliability analysis for the circuit is performed based on the apportioning. In an embodiment, metal paths which predominantly carry currents with an average value less than a threshold are excluded from being considered as contributors to EM degradation.

2 Claims, 3 Drawing Sheets

BUDGETING ELECTROMIGRATION-RELATED RELIABILITY AMONG METAL PATHS IN THE DESIGN OF A CIRCUIT

RELATED APPLICATION(S)

The present application claims the benefit of co-pending U.S. provisional application Ser. No. 61/021,649, entitled: "Real-Time Methodology for Generating Design-Specific Electromigration Design Rules Based on System Complexity and Reliability Requirements", filed on 17 Jan. 2008, naming the same inventors as in the subject application, and is incorporated in its entirety herewith.

BACKGROUND

1. Technical Field

Embodiments of the present disclosure relate generally to reliability of circuits, and more specifically to budgeting electromigration-related reliability among metal paths in the design of a circuit.

2. Related Art

A circuit generally refers to a configuration of electrically or electromagnetically connected components or devices. Integrated circuits (IC), printed circuit boards (PCB), IC package with connection leads, or any other type of circuitry in which wires (metal paths) carry currents are some examples of circuits.

Metal paths are provided in circuits to serve as conducting paths between nodes (signal generation points, power/ground, etc.) of the circuit. For example, as is well known in the relevant arts, signal conducting paths among various circuit nodes in an integrated circuit (IC), as well as power supply delivery paths, are typically provided as metal paths.

Electromigration (EM) generally refers to the dislocation of atoms or ions in conducting materials, such as metals due to the flow of current through the conductor. EM may adversely affect (degrade) the structure of metal paths and accordingly the ICs/PCBs may need to designed for EM-reliability.

EM-related reliability may generally be termed as the ability of a circuit to operate in conformance with desired specifications for a specified period of time, despite electromigration and/or electromigration-related effects. A desired (overall) EM reliability measure (e.g., such as number of hours of operation before a failure due to EM in an IC, printed circuit board (PCB), or a device/system incorporating the IC or PCB can occur), is often specified for an IC/PCB. Circuits are generally designed taking into account the EM considerations.

One general requirement in design of circuits with EM considerations is, budgeting a desired reliability measure among the metal paths in a circuit. Budgeting implies that the circuit is designed such that a path would not contribute more than the allocated budget. In general, it is desirable that budgeting be performed such that requirements presented by corresponding environments are satisfied.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An aspect of the present invention apportions unequally contributions of different metal paths of an integrated circuit (IC) to electromigration (EM) reliability. 'Unequally' implies that the contribution factors are different for at least two metal paths. Due to such unequal apportionment, optimal design as suited for specific environments may be obtained.

In an embodiment, a corresponding parameter value representing a magnitude of excess current flowing in a single direction in each metal path is determined. A desired reliability measure for electromigration (EM) is apportioned among the metal paths based on computed parameter values for the corresponding metal path. A reliability analysis for the IC is performed based on the apportioning.

Due to such an approach, current densities in metal paths (that predominantly carry large average currents) are allowed to be proportionately higher, while still satisfying the desired overall EM reliability measure for an IC.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the features of the invention.

BRIEF DESCRIPTION OF THE VIEWS OF DRAWINGS

The drawing in which an element first appears is indicated by the leftmost digit(s) in the corresponding reference number.

DETAILED DESCRIPTION

Various embodiments are described below with several examples for illustration. However, various features of the present invention will be clearer in comparison with a prior approach. Accordingly, the description of a prior approach is provided first.

1. Prior Approach

Figure 1:
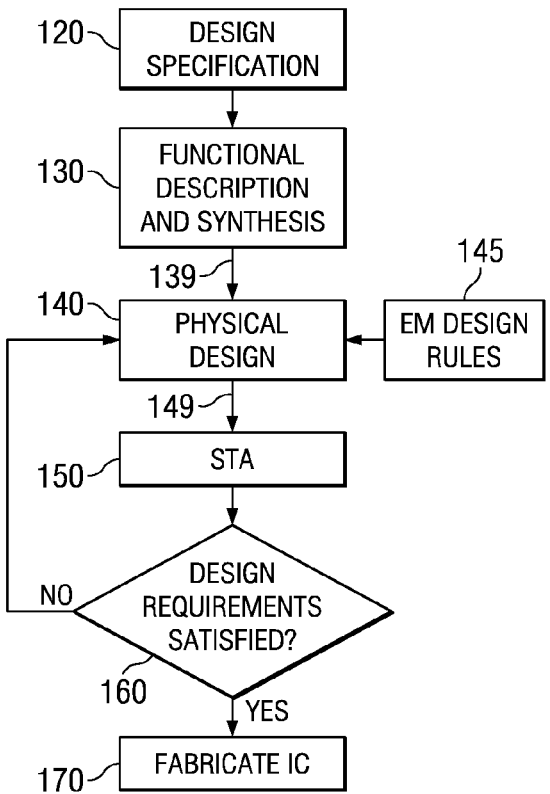
FIG. 1 is a diagram illustrating a design flow cycle for an IC in a prior approach.

FIG. 1 is a diagram illustrating a prior design flow cycle for an IC. The design flow is shown merely for the purpose of illustration, and may include other/alternative phases, and possibly other sequences of the phases as well. The design may start with design specifications (120) of the IC in which the specifications of an IC may be generated. A functional description and synthesis (130) phase may be performed next to create the circuit, a netlist (specifying interconnections between the various components/blocks in the circuit), as well as libraries of the components contained in the IC.

Physical design (140) may be performed next, and generally involves placement of components in the circuit (represented by the corresponding netlist and libraries), and routing the interconnection(s) (signals, etc.) between the components. Physical design (140) may be performed ensuring that timing requirements (e.g., setup and hold times) of various signals in the IC are satisfied. Physical design (140) may generate as outputs, the physical layout of the components in the circuit, post-placement timing of various signals in the circuit, information regarding parasitic elements in the physical layout, etc. Physical design (140) may be performed in a manner consistent with several design requirements to be met (e.g., area of the placed and routed circuit, timing requirements, power consumption, etc). Physical design 140 is performed consistent with electromigration (EM) design rules (145), as noted below.

Static timing analysis (STA) 150 may be performed as a next phase, in which the arrival times of the signals at various paths/nodes in the IC are estimated, typically based on delay models, for example, gate delays, connection-path, wire delays, based on the output of the physical design phase 140. The timings at the various nodes in the design may be checked against desired timing requirements.

If the design requirements are satisfied (decision block 160), the output of the physical design process is sent for fabricating (170) the IC. If the design requirements are not met, then physical design (140) may be performed again. In some instances, functional description and synthesis (130) may be repeated with corresponding modifications, and the following phases may be repeated till the design requirements are met. Thus, the design flow procedure noted above may be iterative.

In a prior approach implemented in the context of FIG. 1, EM design rules (145) provide a single set of rules, corresponding to a desired EM reliability measure (e.g., 5 FIT), to be followed for each metal paths in the IC being designed. The prior approach, therefore, treats all metal paths equally, in that each metal path is deemed to contribute equally to electromigration. The design rule is typically an upper limit on current density on a metal path. Thus, the prior approach provides a single value of current density limit to be ensured for each metal path in the IC. Physical design (140) is performed to ensure that dimensions of each metal path are generated to ensure that the current density limit is not exceeded.

One drawback with the prior approach is that, depending on the specific design (number of metal paths, complexity, etc), the reliability achieved may be more than or lesser than a desired reliability measure. As an illustration, a current limit of 20 mA/(um)^2 [20 milliamperes per square micrometer] may be provided as the current density limit by an IC foundry (or a component engineer) as a requirement to achieve a desired FIT of 10^(-4). For an IC with a large number (e.g., millions) of metal paths, the current limit noted above may be too high to satisfy the desired FIT of 10^(-4).

On the other hand, for an IC with a far lesser number of metal paths (e.g., a few thousand), the current limit noted above may be too low, and the EM reliability of the IC may consequently be much less than the desired reliability. The corresponding lowered current densities in its metal paths may require the paths to be designed with larger widths and heights, potentially leading to larger implementation area.

Further, such a prior approach does not take into account the specific current waveforms (e.g., D.C, pulsed, triangular, etc) that flow through a metal path. As a result, the prior approach limits the current density even though a corresponding current waveform in a path may not significantly cause EM degradation, and therefore contribute only non-significantly to the overall EM reliability measure.

While the description above with respect to FIG. 1 is provided in the context of metal paths in an IC as an illustrative example, similar drawbacks may be associated with such approaches with respect to metal paths in other contexts, such as printed circuit boards (or any circuit containing interconnecting metal paths, in general).

Several features of the present invention overcome one or more of the drawbacks noted above.

2. Budgeting for EM reliability

Figure 2:
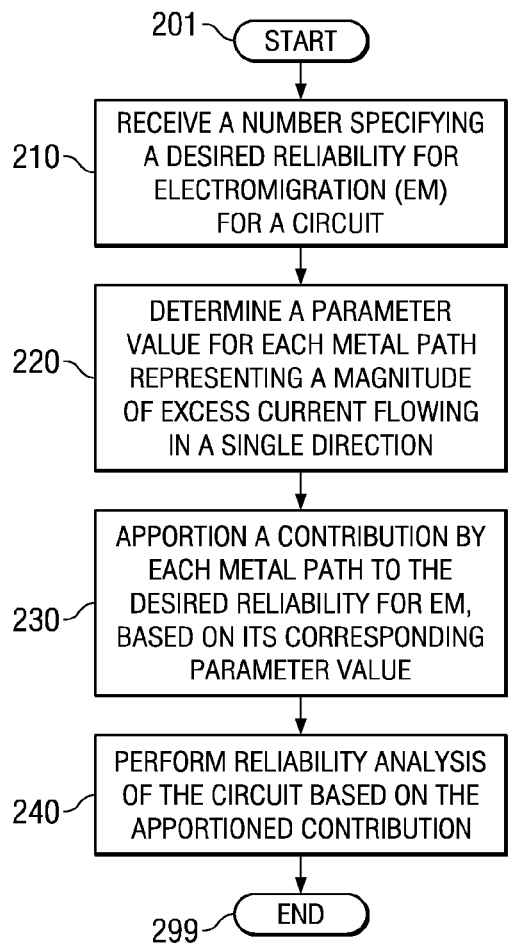
FIG. 2 is a flowchart illustrating the manner in which EM related reliability is budgeted among metal paths in the design of an IC in an embodiment.

FIG. 2 is a flowchart illustrating the manner in which electromigration-related reliability is budgeted among metal paths in the design of a circuit. The flowchart is provided merely by way of illustration, and other techniques, steps, and/or sequence of steps can also be implemented to create the optimized model without departing from the scope and spirit of several aspects of the present invention, as will be apparent to one skilled in the relevant arts by reading the disclosure herein. The flowchart starts in step 201, in which control passes immediately to step 210.

In step 210, a number (desired reliability measure) specifying a desired/required reliability for Electromigration-related effects (EM) for a circuit is received. The number received may specify the desired EM reliability, for example, in terms of FIT (failure in time) described above. Control then passes to step 220.

In step 220, a parameter value for each metal path (metal segment) representing a magnitude of excess current flowing in a single direction is determined. As is well known, currents through a metal path depend on the specific nature of circuits and/or components (including parasitic components) connected to the metal path. A direct current (DC) represents a current flow in one direction (along the length of a metal path, ignoring random fluctuations in the direction of motion of electrons due to various effects such as thermal noise, collisions etc). Alternating current (AC) represents a current flow along both directions of a metal path in an alternating fashion.

Depending on the specific shape (waveform) of the AC current, a 'net' current flow along one direction may be greater than in the other direction. The parameter value determined for a metal path represents the magnitude of such a 'net' excess current flowing in a single direction through the metal path.

It is noted that currents in power supply metal paths may be primarily DC currents, while signal currents (outputs of components in a circuit, for example) may be DC or AC. Degradation in a metal path due to electromigration is generally greater when the current flowing through the metal path is DC than when the current is AC (whether having a non zero DC component or not). It may be appreciated that a parameter value representing a magnitude of excess current flowing in a single direction in a metal path is, therefore, a more precise indicator of reliability degradation in the metal path due to EM.

In an embodiment, a parameter value equal to the square of the ratio of average current and root mean squared (RMS) current through a metal path is determined. Control then passes to step 230.

In step 230, contribution by each metal path to the desired reliability measure for EM (e.g., a FIT number), is apportioned based on the parameter value determined for the metal path. In general, greater the excess current flowing in a single direction, greater is the contribution to the reliability measure (also termed total available EM reliability budget). Thus, metal paths determined to have a greater value of the parameter value are deemed to contribute more to EM degradation, and vice versa. Control then passes to step 240.

In step 240, reliability analysis of the circuit is performed based on the apportioned contributions of each metal path. In general, the reliability analysis is performed to ensure that the sum of the contributions from each metal path equals the reliability measure, with the contributions being apportioned as noted above.

The reliability analysis may include ensuring conformance to rules, such as for example, ensuring current densities on the metal paths be maintained at corresponding computed current density limits. The current density limits may in turn be determined based on corresponding parameter values of the metal paths. For example, metal paths with a greater value of the parameter value may be constrained to have a lower current density limit, while metal paths with a lesser value of the parameter value may be allowed a greater current density limit. Various other considerations such as, for example, temperature rise (termed Joule heating) in the metal path may, in addition, be considered to determine the current density limits. Control ends in step 299.

It may be appreciated from the description above, that in contrast to the prior approach noted above, each metal path is not assumed to contribute equally to EM degradation. Instead, parameter values (indicative of corresponding current waveforms through the metal paths, and therefore the potential EM degradation in the metal paths) are determined.

As a result, a desired EM reliability measure can be met while ensuring allocation of the measure among the metal paths in a circuit in a manner proportional to the EM degradation contributions of the metal paths. The features described above are illustrated in detail next with examples.

3. Generating Reliability Rules for EM

In an embodiment, the parameter used to represent a magnitude of excess current flowing in a single direction (corresponding to the parameter of step 220 of the flowchart of FIG. 2) is termed duty cycle (r), and is computed for each metal path, in the following manner.

$$\text{Duty Cycle}(r) = [(\text{average current}/rms\ \text{current})^2] \quad \text{Equation 1}$$

wherein, average current is the average value of current in the metal path, and rms current is the root mean squared value of the current in the metal path.

In an embodiment, the average current is computed as expressed by the following equation;

$$Iavg = \int_0^{T1} i(t)dt - 0.6\int_{T1}^{T2} 1(t)dt \quad \text{Equation 2}$$

wherein,

Iavg is the average current through a metal path,

Duration (0 to T1) in the integration of equation 2 represents a time interval of current flow during pull-up (change to logic high), Duration (T1 to T2) in the integration of equation 2 represents a time interval of current flow during pull-down (change to logic low), $$Irms = \sqrt{\left[\frac{1}{T}\int_0^T 1(t)dt\right]^2} \quad \text{Equation 3}$$

Wherein,

Irms is the rms current through a metal path,

T is the switching period of the current waveform through the metal path.

Average current in a metal path contributes more to EM degradation than rms current through a metal path. Hence, as noted above, a metal path (e.g., power supply metal paths) with a large value of (r) contributes significantly to EM degradation. A metal path with relatively smaller values of (r) contributes relatively less to EM degradation.

Duty cycle (r) values of all metal paths in an IC are computed according to the relationships noted above. Corresponding to each duty cycle value (ratio), other design rule checks, such as whether acceptable temperature rise in metal paths are checked.

As noted above average current predominantly causes EM degradation. RMS current predominantly contributes to temperature rise. Hence, a large value of duty cycle (r) indicates more contribution to EM degradation, and less contribution to temperature rise. Relatively smaller values of duty cycle (r) indicate correspondingly lesser contribution to EM degradation, with greater contribution to temperature rise.

Figure 3A:
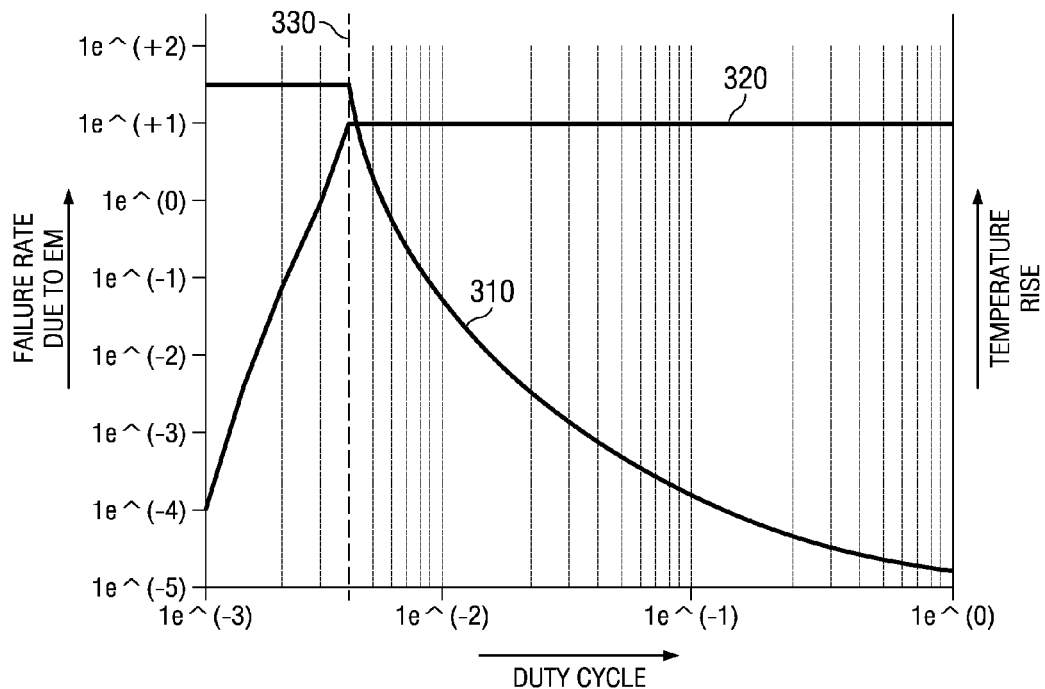
FIG. 3A is an example graph illustrating the relationship among duty cycle, temperature rise and failure rate due to EM in metal paths in an embodiment.

FIG. 3A is an example graph illustrating the relationship between duty cycle, temperature rise and failure rate due to EM in metal paths. Curve 310 is a plot of duty cycle versus temperature rise, and curve 320 is a plot of duty cycle versus failure rate due to EM. It may be observed from curves 310 and 320 that, for duty cycle values greater than a value represented by marker 330, EM contributions are substantially constant, and equal 10 (1e^1), while contributions to temperature rise falls as duty cycle increases. The duty cycle represented by marker 330 may be viewed as a "duty cycle threshold".

On the other hand, for duty cycle values less than that represented by marker 330, EM contribution decreases, while temperature rise remains substantially constant. Based on the determination of the relationship between duty cycle and EM contributions (as well as other design rules, if any, such as limiting temperature rise), apportioning of contributions by each metal path to a desired EM reliability measure may then be determined based on its duty cycle. Assuming the overall desired reliability measure is 5 FIT, the following equation expresses the manner in which EM contributions of metal paths are apportioned, in an embodiment of the present invention:

$$[N(<r330)*\text{FIT}(<r330)]+[N(>r330)*\text{FIT}(>r330)]=5 \quad \text{Equation 4}$$

Wherein,

N(<r330) represents the number of metal paths with duty cycles (r values) less than the duty cycle represented by marker 330, FIT (<r330) represents the total FIT (reliability) contribution by with duty cycles (r values) less than the duty cycle represented by marker 330, N(>r330) represents the number of metal paths with duty cycles (r values) greater than the duty cycle represented by marker 330, FIT (>r330) represents the total FIT (reliability) contribution by with duty cycles (r values) greater than the duty cycle represented by marker 330, and '*' is a multiply operator.

Assuming the EM degradation (and therefore the FIT contribution) by N(<r330) is very small (close to zero), equation 4 reduces to equation 5 provided below:

$$[N(>r330)*\text{FIT}(>r330)]=5 \quad \text{Equation 5}$$

Thus, in one embodiment, metal paths with a duty cycle less than a threshold duty cycle value are deemed not to contribute (or contribute only insignificantly) to EM degradation, and therefore excluded from being considered as contributors to EM degradation.

The duty cycle represented by marker 330, as well as the FIT number of 5 are provided only as illustrative examples, and other values may instead be used, based on the specific type of material used to fabricate the metal paths, acceptable temperature rise, the level of accuracy in estimating reliability, desired reliability measure, and/or other considerations.

Figure 3B:
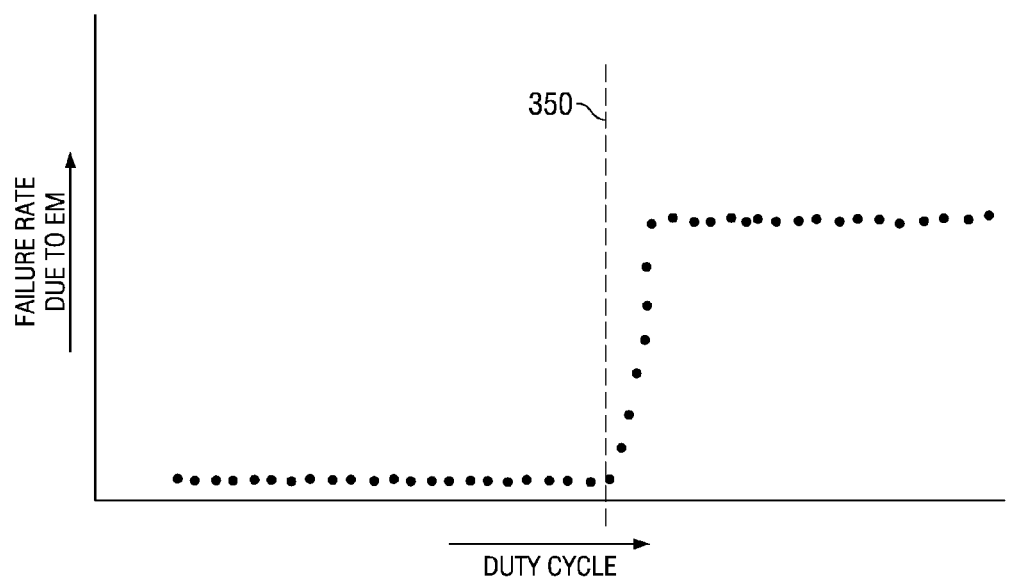
FIG. 3B is a diagram illustrating an example distribution of metal paths with respect to duty cycle, in an embodiment.

FIG. 3B is a diagram illustrating an example distribution of metal paths with respect to duty cycle. Each dot in FIG. 3B represents a metal path. It may be observed that (approximately) 50% of the total metal paths in FIG. 3B have a duty cycle less than that represented by marker 350. Metal paths having duty cycle less than marker 350 (to the left of marker 350) are rms current-dominated and contribute less (or negligibly) to EM degradation. Metal paths having duty cycle greater than marker 350 (to the right of marker 350) are average-current-dominated, and contribute more to EM degradation. Metal paths to the left of marker 350 may be excluded from being considered as contributors to EM, and EM reliability analysis may be performed based only on metal paths to the right of marker 350, as expressed above by equation 5.

In another embodiment, the assumption of zero (or negligible) contribution (as in equation 5) by metal paths similar to those represented by [N(>r330)] above may not be followed. Instead, contributions, however small, may still be considered. In such an alternative embodiment, the following equation may be used to represent apportioning of the contributions:

$$\sum_{i=0}^{N} M_i (FIT)_i = overallFIT \qquad \text{Equation 6}$$

Wherein,
$M_i$ is the $i^{th}$ metal path in an IC,
N is the total number of metal paths in the IC,
$(FIT)_i$ is the FIT contribution of the $i^{th}$ metal path,
overallFIT is the desired EM FIT for the IC.

As noted above (with respect to step 240 of the flowchart of FIG. 2), the apportioning of EM reliability contributions among the metal paths during a reliability analysis phase may be performed consistent with other design constraints. An example illustrating such apportioning with temperature rise (Joule heating) as an additional constraint for metal paths, is described briefly next. The example assumes that overallFIT (desired EM FIT) required is 'A', with a current density of 'j1' assumed to cause an EM degradation (EM reliability contribution) of 'A' FIT, and a current density of 'j2' assumed to cause a temperature rise of 'T1' ° C. Current density j1 is assumed to be less than 1/10 times current density j2.

With the above example assumptions, for metal paths with computed value of duty cycle (r) equaling 1, the average current equals the rms current. Therefore, the limiting constraint for current density to be applied is 'j1', being the smaller of the two current density limits of j1 and j2. For such metal paths (with r=1), the maximum EM FIT contribution is 'A' FIT.

For metal paths with computed value of duty cycle (r) equaling a value such that the rms current equals 10 times the average current, the limiting constraint for current density to be is still j1, since (10 times j1 less than current density limit j2. Again, for such metal paths (with r=0.01), the EM FIT contribution is 'A' FIT.

For metal paths with computed value of duty cycle (r) such that the rms current equals 100 times the average current, the limiting constraint for current density to be applied is j2, since 100 times j1 is greater than j2. For such metal paths (with r=0.0001) the average current that may be allowed is, therefore, j2/100. The EM FIT contribution is therefore much less than 'A' FIT, and may be determined from curves similar to curve 320 of FIG. 3A.

Average current densities on metal paths for other values of (r) may be determined in a similar fashion. In general, for smaller values of (r), the contribution to EM degradation (and overallFIT) reduces. Based on the specific requirements, a reliability engineer may choose to either complete ignore EM contributions for smaller values of (r) (as noted above with respect to Equation 5), or still consider the corresponding smaller contributions (as noted above with respect to Equation 6).

The approach described above enables EM reliability measure to be budgeted among metal paths based on the specific IC or system being designed. 'Overdesigned' for EM reliability may thus be avoided. Current densities may be increased in metal paths that do not significantly contribute to EM degradation, thereby requiring only smaller widths and heights, for such metal paths, and therefore overall smaller implementation area for the IC.

As an example, assuming an IC is designed to contain a total of 1000 metal paths, and is required to have (satisfy) an EM reliability measure of 'X' FIT, if 900 paths are determined to have a duty cycle value far less than the "duty cycle threshold" (as noted above), such paths may be excluded from being considered as contributors to EM. Hence, the available overall EM of 'X' FIT now need be allocated only to the 100 remaining metal paths. It may be appreciated that the 100 metal paths (which may be average-current dominated, such as, for example, power supply paths) may now be allowed to carry much higher current densities, without increase in widths and heights (or with minimal increases only), while still satisfying the desired EM reliability criterion.

Further, with the above approach, reliability analyses may be performed and verified at the design stage of the IC itself, rather than after completion of the design, thereby avoiding time-consuming and expensive design iterations. Example design flows for an IC incorporating the features of the present invention are described next.

4. Modified Design Flow

Figure 4:
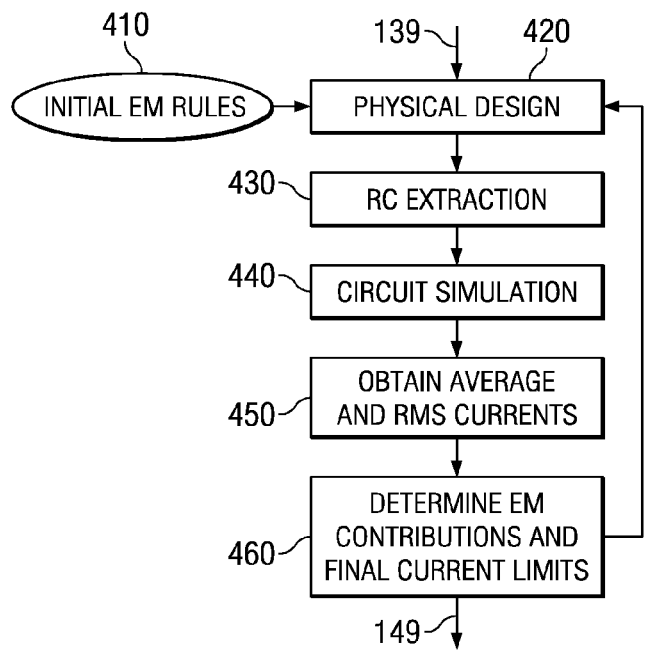
FIG. 4 is a diagram illustrating (portions of) an IC design flow in an embodiment.

FIG. 4 is a diagram illustrating (portions of) an IC design flow in an embodiment of the present invention. Although not shown for ease of description, it is assumed in that design phases corresponding to phases 120, 130, 150, 160 and 170 of FIG. 1 are also performed in addition to those shown in FIG. 4.

Initial EM rules (410) corresponds to EM design rules (145) of FIG. 1, and provides current density limits (e.g., corresponding to temperature rise, EM contribution, desired EM reliability measure, etc.) for metal paths in the IC. Physical design 420 is performed, followed by RC extraction 430 (in which parasitic values of resistances and capacitances at various nodes in the IC are obtained) are performed. A circuit simulation 440 (for example using SPICE tools) is performed, and based on the output of the simulations average and rms currents (450) on each metal path in the IC are determined. Duty cycle (r) for each of the metal paths may be determined based on the values of the average and rms currents.

Based on the output of phase 450, and based on the constraints provided by initial EM rules (410), EM contributions of each metal path may be determined in phase 460. Assuming some of the metal paths are not significant EM contributors (as may be determined by phase 460), other metal paths may be allowed correspondingly larger current densities (than if the above techniques were not used), while still satisfying a desired EM reliability. Thus, final current density limit values for each metal path are also determined in phase 460.

Figure 5:
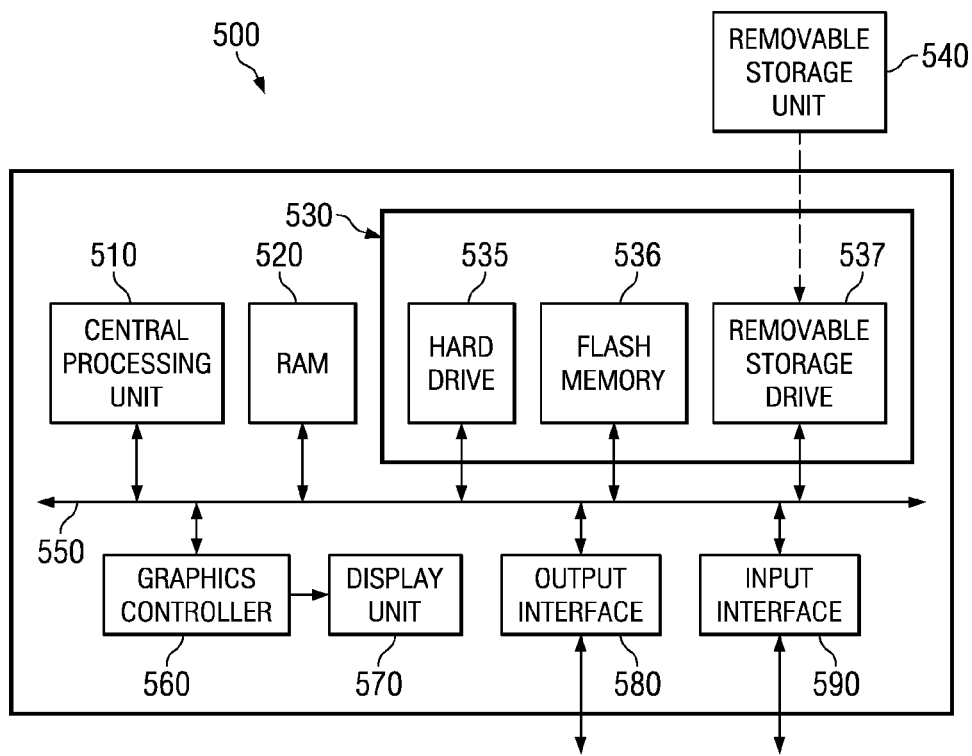
FIG. 5 is a block diagram illustrating the details of a system in which several embodiments are operative by execution of appropriate modules stored on a computer readable medium.

The operations described with respect to FIG. 5 require physical design to be completed, and spice simulations to be performed to enable the determination of phase 460, and therefore may be time-consuming in some design scenarios.

In another embodiment of the present invention, timing analysis performed prior to physical design 420 (for example, based on a synthesized functional description of an IC such as would be provided by phase 130 of FIG. 1) is used to determine duty cycle (parameter value of step 220 of FIG. 2, in general), EM contributions, and final current densities noted with respect to FIG. 5. As is well known, a synthesized functional description may not contain any metal paths (interconnections assumed to be logical interconnections).

A pre-physical-design timing analysis (for example, performed using corresponding timing analysis EDA tools) however, still provides waveforms (current, voltage, etc.) at nodes of the design (e.g., output of a cell/circuit portion, or an internal node within a cell, etc). Hence, even though "physical" metal paths are not yet created, duty cycle (r) may still be estimated (substantially accurately) using formulas, i.e., average and rms currents flowing 'out of' a cell and 'into' another cell (via a yet-to-be provided metal interconnecting path), as well as power supply/ground currents can still be estimated.

Based on the estimated average and rms currents (in general, characteristics such as magnitude, variation with respect to time, etc.), duty cycle values for the yet-to-be-created metal paths may be obtained. It is noted that, duty cycle values thus obtained may be largely independent of the physical dimensions of the metal paths created during a later physical design phase, and are thus fairly precise.

In an embodiment, the following formulas are used to compute average and rms currents on a 'yet-to-be-created' metal path:

$$Iavg = C*V*f \qquad \text{Equation 7}$$

wherein,

C is the value of load capacitance (e.g., input capacitance of cell receiving the current as input)

V is at the node for which Iavg is being computed, and f is the switching frequency of a driver cell generating current on the yet-to-be-created metal path.

$$Irms = C*V*\{[(8f)/(3S)]^{0.5}\} \qquad \text{Equation 8}$$

wherein, f is as described with respect to equation 7 above, and

S represents the slew or the charging-discharging time of the current waveform.

It should be appreciated that the above formulations are just one approach of 'a priori' estimation (prior to physical design), based on timing analysis, the anticipated (or estimated) current flow in the metal paths (interconnects). Using such estimation, the duty cycle of the 'yet-to-be-created' metal paths can be readily obtained, and one can accordingly budget EM reliability in metal paths, much before the actual physical design phase.

Several features of the present invention can be realized by hardware, executable modules stored on a computer readable medium, or a combination of both. In general, when throughput performance is of primary consideration, the implementation is performed more in hardware (e.g., in the form of an application specific integrated circuit). When cost is of primary consideration, the implementation is performed more using a processor executing modules stored on a computer readable medium. Cost and performance can be balanced by employing a combination of hardware and executable modules stored on a computer readable medium. In an embodiment, the operations described with respect to FIG. 2, 3A and 4 are operative upon execution of appropriate modules stored on a computer readable medium, as described below with an example.

5. Digital Processing System

FIG. 5 is a block diagram illustrating the details of digital processing system 500 in which several aspects of the present invention are operative by execution of appropriate modules stored on a computer readable medium. Digital processing system 500 may be used to implement various phases of operations of FIGS. 2, 3A and 4, as well as other operations that may be required associated with the operations therein, and as described above.

Digital processing system 500 may contain one or more processors such as a central processing unit (CPU) 510, random access memory (RAM) 520, secondary memory 530, graphics controller 560, display unit 570, output interface 580 and input interface 590. All the components may communicate with each other over communication path 550, which may contain several buses as is well known in the relevant arts.

CPU 510 may execute instructions stored in RAM 520 to provide several features of the present invention. CPU 510 may contain multiple processing units, with each processing unit potentially being designed for a specific task. Alternatively, CPU 510 may contain only a single general-purpose processing unit. RAM 520 may receive instructions from secondary memory 530 using communication path 550.

Input interface 590 may correspond to a keyboard and a pointing device (e.g., touch-pad, mouse) and may be used to provide various inputs, including design specification of a circuit, EM reliability measure, current density limits for metal paths, etc. Output interface 580 provides connectivity to devices external to system 500, and may be used to communicate with other connected systems (not shown). Output interface may be used to output a placed-and-routed design of an IC.

Secondary memory 530 may contain hard drive 535, flash memory 536, and removable storage drive 537. Secondary memory 530 may store the data (e.g., design information for a circuit to be designed, EM reliability measure, current density limits, etc.,) and instructions, which enable digital processing system 500 to provide several features in accordance with the present invention.

Some or all of the data and instructions may be provided on removable storage unit 540, and the data and instructions may be read and provided by removable storage drive 537 to CPU 510. Floppy drive, magnetic tape drive, CD-ROM drive, DVD Drive, Flash memory, removable memory chip (PCMCIA Card, EPROM) are examples of such removable storage drive 537.

Removable storage unit 540 may be implemented using medium and storage format compatible with removable storage drive 537 such that removable storage drive 537 can read the data and instructions. Thus, removable storage unit 540 includes a machine readable (storage) medium having stored therein computer software and/or data. However, the computer (or machine, in general) readable medium can be in other forms (e.g., non-removable, or removable, etc.).

In this document, the term "computer program product" is used to generally refer to removable storage unit 540 or hard disk installed in hard drive 535. These computer program products are means for providing software to digital processing system 500. CPU 510 may retrieve the software instructions, and execute the instructions to provide various features of the present invention described above.

Blocks (e.g., blocks corresponding to design phases or operations of FIGS. 2 and 4) may be implemented by execution of instructions by various types of processors. An identified module of executable code may, for instance, contain one or more physical or logical blocks of computer instructions, which may, for instance, be organized as an object, procedure, or function. Nevertheless, the executables of an identified module need not be physically located together, but may contain disparate instructions stored in different locations which when joined logically together constitute the module/block and achieve the stated purpose for the module/block.

It may be appreciated that a module/block of executable code could be a single instruction, or many instructions and may even be distributed over several code segments, among different programs, and across several memory devices. Further, the functionality described with reference to a single module/block can be split across multiple modules/blocks or alternatively the functionality described with respect to multiple modules/blocks can be combined into a single (or other combination of blocks) as will be apparent to a skilled practitioner based on the disclosure provided herein.

Reference throughout this specification to "one embodiment", "an embodiment", or similar language means that a particular feature, structure, or characteristic described in connection with the embodiment is included in at least one embodiment of the present invention. Thus, appearances of the phrases "in one embodiment", "in an embodiment" and similar language throughout this specification may, but do not necessarily, all refer to the same embodiment.

While various embodiments of the present invention have been described above, it should be understood that they have been presented by way of example only, and not limitation. Thus, the breadth and scope of the present invention should not be limited by any of the above-described embodiments, but should be defined only in accordance with the following claims and their equivalents.

What is claimed is:

1. An apparatus for designing a circuit, the circuit containing a plurality of metal paths, the apparatus comprising:
    at least one non-transitory computer readable medium; and
    a non-transitory computer readable program code stored on said at least one non-transitory computer readable medium, said non-transitory computer readable program code comprising instructions for:
        receiving a value specifying a desired reliability measure for electromigration (EM) to be provided for said circuit;
        receiving a first current density limit and a second current density limit, wherein said first current density limit represents a maximum value of current density corresponding to said desired reliability measure, and said second current density limit represents a maximum value of current density corresponding to a maximum allowed temperature rise in a metal path;
        determining a duty cycle parameter representing a ratio of an average current and an rms (root mean squared) current in a metal path for each metal path contained in said plurality of metal paths;
        determining for each metal path contained in said plurality of metal paths a maximum current allowed to flow based on the duty cycle computed, said first current density limit and said second current density limit; and
        performing a reliability analysis of said circuit.

2. A system for designing a circuit, said circuit containing a plurality of metal paths, said system comprising:
    a processor;
    a random access memory; and
    a non-transitory machine readable medium storing one or more sequences of instructions, wherein execution of said one or more sequences of instructions by said processor causes said system to perform the actions of:
        receiving a value specifying a desired reliability measure for electromigration (EM) to be provided for said circuit;
        receiving a first current density limit and a second current density limit, wherein said first current density limit represents a maximum value of current density corresponding to said desired reliability measure, and said second current density limit represents a maximum value of current density corresponding to a maximum allowed temperature rise in a metal path;
        determining a duty cycle parameter representing a ratio of an average current and an rms (root mean squared) current in a metal path for each metal path contained in said plurality of metal paths;
        determining for each metal path contained in said plurality of metal paths a maximum current allowed to flow based on the duty cycle computed, said first current density limit and said second current density limit; and
        performing a reliability analysis of said circuit.

* * * * *